US012255086B2

(12) United States Patent
Tsujimoto

(10) Patent No.: US 12,255,086 B2
(45) Date of Patent: Mar. 18, 2025

(54) PROCESSING METHOD OF WAFER

(71) Applicant: DISCO CORPORATION, Tokyo (JP)

(72) Inventor: Kohei Tsujimoto, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 1247 days.

(21) Appl. No.: 16/997,332

(22) Filed: Aug. 19, 2020

(65) Prior Publication Data

US 2021/0057261 A1   Feb. 25, 2021

(30) Foreign Application Priority Data

Aug. 21, 2019   (JP) .................................. 2019-151169

(51) Int. Cl.
*H01L 21/683* (2006.01)
*B24B 7/22* (2006.01)
*H01L 21/304* (2006.01)

(52) U.S. Cl.
CPC .......... *H01L 21/6836* (2013.01); *B24B 7/228* (2013.01); *H01L 21/304* (2013.01);
(Continued)

(58) Field of Classification Search
CPC ....... B24B 37/04; B24B 37/042; B24B 37/10; B24B 37/30; B24B 37/32; B24B 37/34;
(Continued)

(56) References Cited

U.S. PATENT DOCUMENTS

2003/0064579 A1 * 4/2003 Miyakawa ................. C09J 7/29
438/643
2005/0170612 A1 * 8/2005 Miyanari ............ H01L 21/6835
438/464
(Continued)

FOREIGN PATENT DOCUMENTS

EP    1022778 A1 * 7/2000 ........... B24B 37/042
JP   2005246491 A    9/2005
(Continued)

OTHER PUBLICATIONS

Search report issued in counterpart Singapore patent application No. 10202007432V, dated Jun. 15, 2021.
(Continued)

*Primary Examiner* — David S Posigian
*Assistant Examiner* — Alberto Saenz
(74) *Attorney, Agent, or Firm* — Greer, Burns & Crain, Ltd.

(57) ABSTRACT

A wafer processing method includes sticking an adhesive tape to the front surface of a wafer, disposing a thermocompression bonding sheet on the adhesive tape stuck to the front surface of the wafer. The thermocompression bonding sheet is heated and pressed by a flat member to execute pressure bonding of the thermocompression bonding sheet to the adhesive tape and integrate the thermocompression bonding sheet with the wafer. The processing method also includes holding the side of the thermocompression bonding sheet on a chuck table of a grinding apparatus and grinding the wafer into a desired thickness while supplying grinding water to the back surface of the wafer. The integrated wafer is separated from the chuck table and the thermocompression bonding sheet is separated from the adhesive tape.

3 Claims, 5 Drawing Sheets

(52) U.S. Cl.
CPC ............ *H01L 2221/68327* (2013.01); *H01L 2221/6834* (2013.01); *H01L 2221/68381* (2013.01)

(58) Field of Classification Search
CPC ... B24B 37/102; B24B 37/105; B24B 37/107; B24B 7/04; B24B 7/228; H01L 21/304; H01L 21/6836; H01L 21/68327; H01L 21/6834; H01L 21/68381; H01L 21/68386
USPC ................. 451/10, 41, 285, 287, 289, 290
See application file for complete search history.

(56) References Cited

U.S. PATENT DOCUMENTS

| | | | |
|---|---|---|---|
| 2007/0087661 A1* | 4/2007 | Koyata | B28D 5/024 451/41 |
| 2009/0199957 A1* | 8/2009 | Inao | H01L 21/6835 156/154 |

FOREIGN PATENT DOCUMENTS

| | | | | |
|---|---|---|---|---|
| JP | 2012015444 | A | 1/2012 | |
| JP | 2014150121 | A | 8/2014 | |
| WO | 2013021644 | A1 | 2/2013 | |
| WO | WO-2018210426 | A1 * | 11/2018 | ............ C09J 7/00 |

OTHER PUBLICATIONS

DE App. 10 2020 210 584.7: English translation of Office Action, Oct. 2, 2024 (4 pages).

* cited by examiner

PROCESSING METHOD OF WAFER

BACKGROUND OF THE INVENTION

Field of the Invention

The present invention relates to a processing method of a wafer for grinding the back surface of the wafer on which plural devices are formed on the front surface in such a manner as to be marked out by plural planned dividing lines that intersect.

Description of the Related Art

A wafer on which plural devices such as an integrated circuit (IC) and large scale integration (LSI) are formed on the front surface in such a manner as to be marked out by plural planned dividing lines that intersect is protected through sticking of a protective tape to the front surface. Thereafter, the protective tape side is held by a chuck table of a grinding apparatus and the back surface is ground, so that the wafer is formed into a desired thickness (for example, refer to Japanese Patent Laid-open No. 2005-246491).

The wafer formed into the desired thickness in the above-described manner is divided into individual device chips by a dicing apparatus or a laser processing apparatus. The device chips obtained by the dividing are used for pieces of electrical equipment such as mobile phones and personal computers.

The grinding apparatus is substantially composed of the chuck table that holds a wafer, a grinding unit rotatably having a grinding abrasive stone that grinds the wafer held by this chuck table, grinding water supply means that supplies grinding water to the wafer and the grinding abrasive stone, and a cleaning unit that cleans the ground wafer. The grinding apparatus can grind the wafer into a desired thickness.

SUMMARY OF THE INVENTION

When the back surface of a wafer is ground by the grinding apparatus, most grinding dust generated due to the grinding is made to flow to the outside of the chuck table by the grinding water. However, because a negative pressure is made to act on the upper surface (holding surface) of the chuck table and the wafer is sucked and held, part of the grinding dust enters from a gap between the chuck table and the protective tape and adheres to the lower surface side of the protective tape stuck to the wafer held by the chuck table. In particular, when the protective tape is stuck to the front surface of the wafer with the intermediary of a glue agent or the like, undulation is formed on the front surface side of the wafer. This undulation lowers the degree of adhesion between the chuck table and the protective tape, which possibly becomes a cause of the entry of the grinding dust into a gap between the chuck table and the protective tape. Moreover, although the ground surface is cleaned by a cleaning unit disposed in the grinding apparatus for the wafer for which the grinding processing has been completed as above, cleaning for the protective tape side of the wafer held by the chuck table is not sufficiently executed. Therefore, there is a problem that the wafer becomes a contamination source when being conveyed to the next step.

Thus, an object of the present invention is to provide a processing method of a wafer in which grinding dust is kept from adhering to an adhesive tape stuck to the held surface side of a wafer held by a chuck table when grinding processing is executed.

In accordance with an aspect of the present invention, there is provided a processing method of a wafer for grinding a back surface of the wafer on which a plurality of devices are formed on a front surface in such a manner as to be marked out by a plurality of planned dividing lines that intersect. The processing method includes an adhesive tape sticking step of sticking an adhesive tape to the front surface of the wafer, a thermocompression bonding sheet disposing step of disposing a thermocompression bonding sheet on the adhesive tape stuck to the front surface of the wafer, and an integration step of heating the thermocompression bonding sheet and pressing the thermocompression bonding sheet by a flat member to execute pressure bonding of the thermocompression bonding sheet to the adhesive tape and integrate the thermocompression bonding sheet with the wafer. The processing method also includes a grinding step of holding the side of the thermocompression bonding sheet on a chuck table of a grinding apparatus and grinding the wafer into a desired thickness while supplying grinding water to the back surface of the wafer, after the integration step is executed, and a separation step of carrying out the wafer integrated with the thermocompression bonding sheet from the chuck table and separating the thermocompression bonding sheet from the adhesive tape.

Preferably, the thermocompression bonding sheet is partly heated or cooled, and a temperature difference is generated to separate the thermocompression bonding sheet from the adhesive tape in the separation step.

Preferably, the thermocompression bonding sheet is a polyolefin-based sheet or a polyester-based sheet. When the thermocompression bonding sheet is the polyolefin-based sheet, preferably the thermocompression bonding sheet is selected from a group consisting of a polyethylene sheet, a polypropylene sheet, and a polystyrene sheet. The temperature when the thermocompression bonding sheet is heated in the integration step is 120° C. to 140° C. when the thermocompression bonding sheet is the polyethylene sheet, the temperature is 160° C. to 180° C. when the thermocompression bonding sheet is the polypropylene sheet, and the temperature is 220° C. to 240° C. when the thermocompression bonding sheet is the polystyrene sheet.

When the thermocompression bonding sheet is the polyester-based sheet, preferably the thermocompression bonding sheet is selected from either a polyethylene terephthalate sheet or a polyethylene naphthalate sheet. The temperature when the thermocompression bonding sheet is heated in the integration step is 250° C. to 270° C. when the thermocompression bonding sheet is the polyethylene terephthalate sheet, and the temperature is 160° C. to 180° C. when the thermocompression bonding sheet is the polyethylene naphthalate sheet.

According to the processing method of a wafer according to the present invention, grinding dust is kept from adhering directly to the adhesive tape. Thus, the problem that the grinding dust becomes a contamination source in the next step when the wafer is conveyed to the next step is solved.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A processing method of a wafer according to an embodiment of the present invention will be described in detail below with reference to the accompanying drawings. The processing method of a wafer according to the present embodiment includes an adhesive tape sticking step of sticking an adhesive tape to the front surface of the wafer, a thermocompression bonding sheet disposing step of disposing a thermocompression bonding sheet on the adhesive tape stuck to the front surface of the wafer, and an integration step of heating the thermocompression bonding sheet and pressing the thermocompression bonding sheet by a flat member to execute pressure bonding of the thermocompression bonding sheet to the adhesive tape and integrate the thermocompression bonding sheet with the wafer. The processing method of a wafer also includes a grinding step of grinding the wafer into a desired thickness while holding the side of the thermocompression bonding sheet on a chuck table of a grinding apparatus and supplying grinding water to the back surface of the wafer and a separation step of carrying out the wafer integrated with the thermocompression bonding sheet from the chuck table and separating the thermocompression bonding sheet from the adhesive tape. Each step will be described below in sequence.

Adhesive Tape Sticking Step

Figure 1:
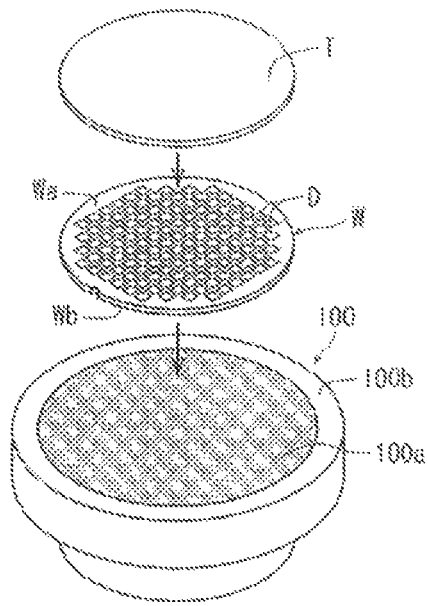
FIG. 1 is a perspective view depicting the implementation form of an adhesive tape sticking step.

In FIG. 1, a perspective view depicting the implementation form of the adhesive tape sticking step is depicted. In execution of the adhesive tape sticking step, first, a wafer W that is a processing target depicted in FIG. 1, an adhesive tape T stuck to the wafer W, and a chuck table 100 for executing the adhesive tape sticking step and the thermocompression bonding sheet disposing step to be described later are prepared. The wafer W is composed of, for example, silicon (Si), and plural devices D are formed on a front surface Wa in such a manner as to be marked out by planned dividing lines. For example, the adhesive tape T is composed of a circular polyvinyl chloride sheet set to substantially the same shape as the wafer W and an adhesive agent (for example, acrylic resin) applied on a surface of this polyvinyl chloride sheet. The chuck table 100 is composed of a suction adhesion chuck 100a that is composed of porous ceramic having air permeability and has a circular disc shape and a circular frame part 100b that surrounds the circumference of the suction adhesion chuck 100a. The chuck table 100 can suck and hold the wafer W placed on the upper surface (holding surface) of the suction adhesion chuck 100a through actuation of suction means that is not depicted in the diagram.

After the wafer W, the adhesive tape T, and the chuck table 100 have been prepared as described above, the adhesive tape T is stuck to the front surface Wa on which the devices D are formed in the wafer W in such a manner that the side on which the adhesive agent is applied in the adhesive tape T is oriented to the front surface Wa. In the case of sticking the adhesive tape T to the front surface Wa of the wafer W, it is possible to use the chuck table 100 depicted in FIG. 1. Further, it is also possible to stick the adhesive tape T by using a well-known tape sticking machine (diagrammatic representation is omitted) or the like in advance.

Thermocompression Bonding Sheet Disposing Step

Figure 2:
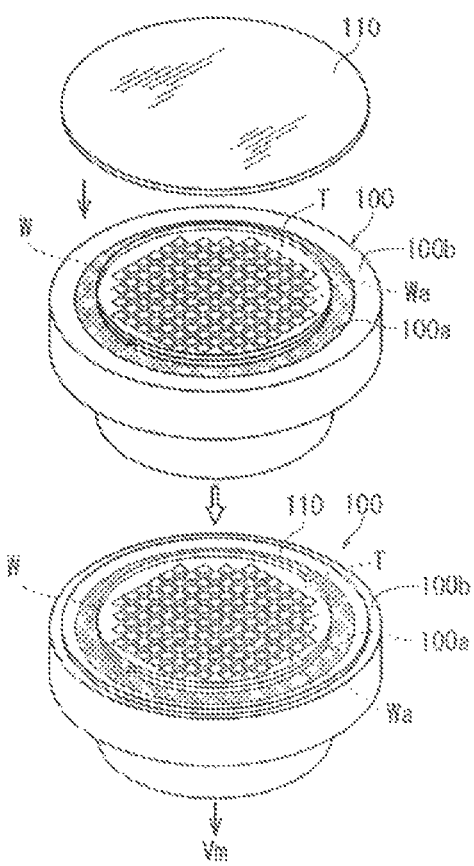
FIG. 2 is a perspective view depicting the implementation form of a thermocompression bonding sheet disposing step.

After the adhesive tape T has been stuck in the above-described manner, as depicted in FIG. 2, the thermocompression bonding sheet disposing step is executed. First, the wafer W in which the adhesive tape T has been stuck to the front surface Wa by the above-described adhesive tape sticking step is prepared, and the wafer W is placed at the center of the suction adhesion chuck 100a of the chuck table 100 in such a manner that the side of the front surface Wa to which the adhesive tape T is stuck in the wafer W is oriented upward and the side of a back surface Wb is oriented downward as depicted in FIG. 2. After the wafer W has been placed on the suction adhesion chuck 100a, a circular thermocompression bonding sheet 110 formed with a thickness of 20 to 100 μm is placed on the adhesive tape T stuck to the wafer W. As the thermocompression bonding sheet 110, a polyolefin-based sheet or a polyester-based sheet can be selected. In the case of the polyolefin-based sheet, a polyethylene (PE) sheet is selected, for example. As is understood from FIG. 2, the diameter of the suction adhesion chuck 100a is set somewhat larger than the diameter of the wafer W. Thus, through the placement of the wafer W at the center of the suction adhesion chuck 100a, the state in which the suction adhesion chuck 100a is exposed in such a manner as to surround the circumference of the wafer W is made. The thermocompression bonding sheet 110 has a size with which at least the wafer W can be covered. Preferably, the thermocompression bonding sheet 110 is formed with a diameter larger than the diameter of the suction adhesion chuck 100a and is formed with a diameter slightly smaller than the circular frame part 100b of the chuck table 100. This allows the whole surface of the suction adhesion chuck 100a and the wafer W to be covered by the thermocompression bonding sheet 110. An adhesive layer of a glue agent or the like is not formed on the thermocompression bonding sheet 110 placed on the adhesive tape T.

The above-described thermocompression bonding sheet 110 is a sheet that exerts an adhesive force by heating but is not limited to the above-described polyethylene sheet. In the case of employing the polyolefin-based sheet as the thermocompression bonding sheet 110, besides the above-described polyethylene sheet, a polypropylene (PP) sheet or a polystyrene (PS) sheet can be employed, for example. Furthermore, in the case of employing the polyester-based sheet as the thermocompression bonding sheet 110, either a polyethylene terephthalate (PET) sheet or a polyethylene naphthalate (PEN) sheet can be employed, for example.

After the wafer W to which the adhesive tape T is stuck and the thermocompression bonding sheet 110 have been placed over the chuck table 100, the suction means that includes a suction pump or the like and is not depicted in the diagram is actuated, and a suction force Vm is made to act on the suction adhesion chuck 100a to suck the wafer W and the thermocompression bonding sheet 110. Because the whole area of the upper surface (holding surface) of the suction adhesion chuck 100a and the wafer W are covered by the thermocompression bonding sheet 110 as described above, the suction force Vm acts on the whole of the wafer W and the thermocompression bonding sheet 110, and the wafer W and the thermocompression bonding sheet 110 are sucked and held on the suction adhesion chuck 100a. In addition, air that remains between the adhesive tape T on the wafer W and the thermocompression bonding sheet 110 is sucked, and both are brought into tight contact with each other. On the surface of the adhesive tape T, minute recesses and protrusions including undulation generated due to the influence of the plural devices D and the adhesive agent given to the stuck surface of the adhesive tape T are formed. However, due to the suction and holding by the chuck table 100, the remaining air is sucked from the minute-recess-protrusion surface on the adhesive tape T, which makes the state in which the thermocompression bonding sheet 110 is in tight contact with the adhesive tape T. Through the above, the thermocompression bonding sheet disposing step is completed.

Integration Step

After the above-described thermocompression bonding sheet disposing step has been executed, subsequently the integration step is executed. The integration step will be described with reference to FIG. 3.

Figure 3:
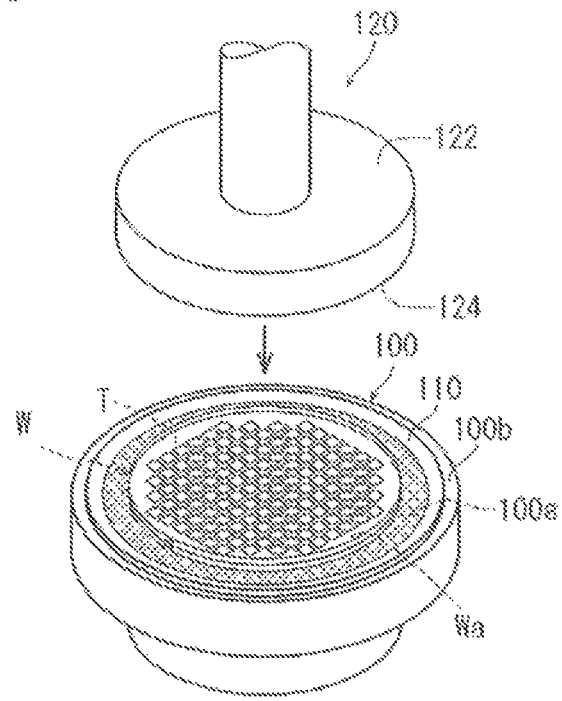
FIG. 3 is a perspective view depicting the implementation form of an integration step.

For the execution of the integration step, as depicted in FIG. 3, integrating means 120 (only part thereof is depicted) for heating the thermocompression bonding sheet 110 and pressing the thermocompression bonding sheet 110 to integrate the thermocompression bonding sheet 110 with the wafer W is positioned above the chuck table 100 in the state of sucking and holding the wafer W and the thermocompression bonding sheet 110. The integrating means 120 includes a circular-disc-shaped flat member 122 in which a heater and a temperature sensor (diagrammatic representation is omitted) are internally incorporated, and a lower surface 124 is a flat surface coated with a fluorine resin. The diameter of the flat member 122 is set equivalent to at least the diameter of the wafer W or larger.

After the integrating means 120 has been positioned above the chuck table 100, the heater incorporated in the integrating means 120 is actuated, and the flat member 122 is lowered to press the thermocompression bonding sheet 110 disposed on the wafer W. Due to the actuation of the heater and the temperature sensor of the flat member 122, the lower surface 124 of the flat member 122 is controlled to be at 120° C. to 140° C. The thermocompression bonding sheet 110 of the present embodiment is a polyethylene sheet as described above. By being heated at 120° C. to 140° C., the temperature of the thermocompression bonding sheet 110 is brought close to the temperature at which the polyethylene sheet melts. Thus, the adhesion force is exerted, and the thermocompression bonding sheet 110 softens. Then, because of the state in which the thermocompression bonding sheet 110 is in tight contact with the minute recesses and protrusions formed on the adhesive tape T stuck to the front surface Wa of the wafer W, the degree of adhesion between the thermocompression bonding sheet 110 that has softened due to the heating and the adhesive tape T on the wafer W increases, so that pressure bonding is executed by the action of the adhesion force of the thermocompression bonding sheet 110 exerted through the heating. Furthermore, because the lower surface 124 of the flat member 122 is a flat surface, the surface of the thermocompression bonding sheet 110 stuck onto the adhesive tape T on the wafer W is planarized. Through the above, the integration step by which the thermocompression bonding sheet 110 is pressure-bonded onto the adhesive tape T and is integrated with the wafer W is completed. As described above, the lower surface 124 of the flat member 122 is coated with a fluorine resin. Therefore, even when the thermocompression bonding sheet 110 is heated and the adhesion force is exerted, it is possible to favorably separate the flat member 122 from the thermocompression bonding sheet 110.

In the above-described integration step, the example is depicted in which the flat member 122 in which the heater is incorporated like that depicted in FIG. 3 is used as means that heats the thermocompression bonding sheet 110 to execute pressure bonding of the thermocompression bonding sheet 110 onto the adhesive tape T on the wafer W and integrate the thermocompression bonding sheet 110 with the wafer W. However, the present invention is not limited thereto. For example, the integrating means can include heating means separately from the flat member 122. In this case, the thermocompression bonding sheet 110 can be heated to a predetermined temperature by this heating means and be pressed by the flat member 122 with the above-described shape, so that pressure bonding thereof can be executed. Furthermore, it is also possible to irradiate the surface of the thermocompression bonding sheet 110 with infrared rays to execute heating and thereafter execute pressing by a flat member with a roller shape to implement pressure bonding. Alternatively, it is also possible to execute heating to a predetermined temperature and pressing by a roller in which a heater and a temperature sensor are incorporated to execute pressure bonding of the thermocompression bonding sheet 110 onto the adhesive tape T.

In the present embodiment, subsequently to the above-described integration step, a cutting step of cutting the thermocompression bonding sheet 110 along the shape of the wafer W is executed in consideration of the grinding step executed in a later step. The cutting step does not necessarily need to be executed. However, when it is executed, handling of the wafer W integrated with the thermocompression bonding sheet 110 becomes easier, which is more convenient for the grinding step to be described later. The cutting step will be described below with reference to FIG. 4.

Cutting Step

Figure 4:
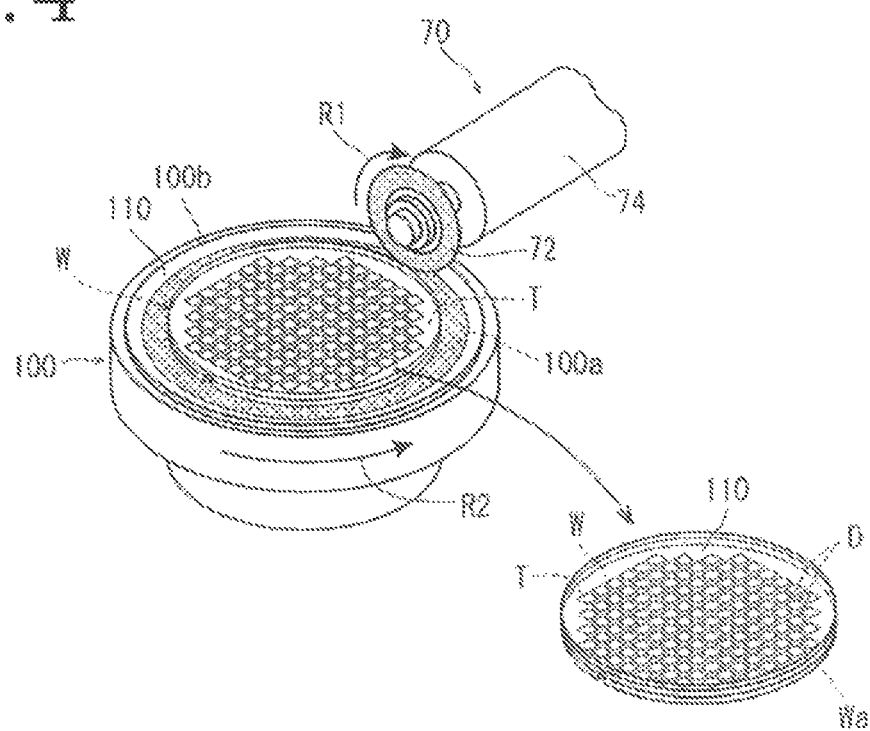
FIG. 4 is a perspective view depicting the implementation form of a cutting step.

As depicted in FIG. 4, a cutting unit 70 (only part thereof is depicted) is positioned above the chuck table 100 that sucks and holds the wafer W to which the thermocompression bonding sheet 110 has been pressure-bonded. Specifically, the cutting unit 70 includes a circular-disc-shaped cutting blade 72 for cutting the thermocompression bonding sheet 110 and a motor 74 for rotationally driving the cutting blade 72 in a direction depicted by an arrow R1, and the blade edge of the cutting blade 72 is positioned to correspond to the circumferential position of the wafer W. After the cutting blade 72 has been positioned to the circumferential position of the wafer W, cutting-in feeding of the cutting blade 72 is executed by the thickness of the thermocompression bonding sheet 110, and the chuck table 100 is rotated in a direction depicted by an arrow R2. Thereby, the thermocompression bonding sheet 110 is cut along the circumference of the wafer W, and the surplus part of the thermocompression bonding sheet 110 protruding from the circumference of the wafer W can be cut to be separated. Through the above, the cutting step is completed.

Grinding Step and Thermocompression Bonding Sheet Cleaning Step

After the wafer W, the adhesive tape T, and the thermocompression bonding sheet 110 have been integrated by the integration step in the above-described manner, the grinding step of grinding the back surface Wb of the wafer W is executed. In the following, with reference to FIG. 5, a grinding apparatus 1 suitable to execute the grinding step will be described.

Figure 5:
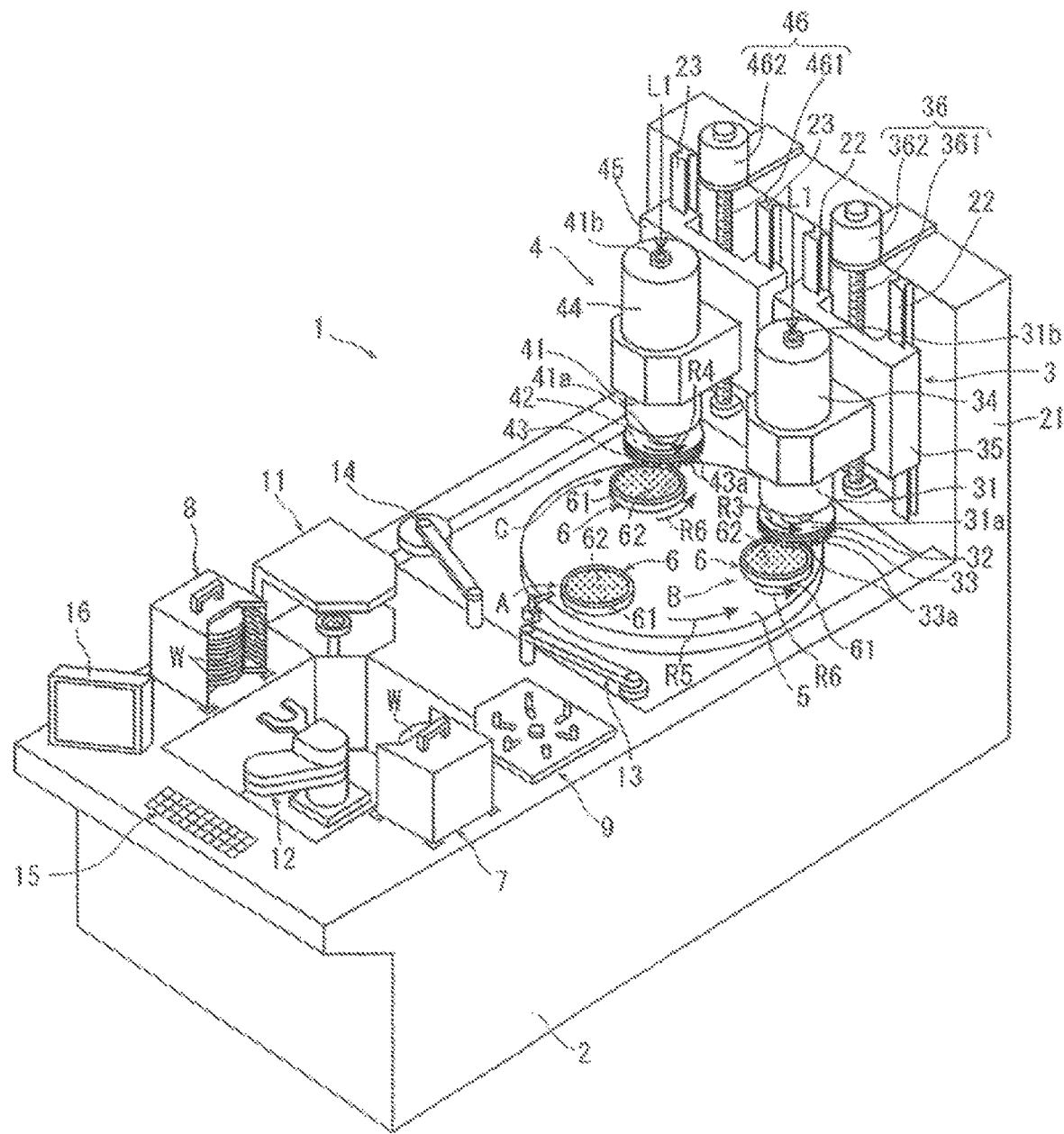
FIG. 5 is an overall perspective view of a grinding apparatus suitable for the present embodiment.

The grinding apparatus 1 includes an apparatus housing 2 with a substantially rectangular parallelepiped shape. In FIG. 5, a stationary support plate 21 is disposed upright at the upper end of the apparatus housing 2 on the right side. On the inside wall surface of the stationary support plate 21, two pairs of guide rails 22 and 23 that extend in the upward-downward direction are disposed. A coarse grinding unit 3 as a coarse grinding unit is mounted on one pair of guide rails 22 movably in the upward-downward direction. A finishing grinding unit 4 as a finishing grinding unit is mounted on the other pair of guide rails 23 movably in the upward-downward direction.

The coarse grinding unit 3 includes a unit housing 31 and a coarse grinding wheel 33 that is mounted on a wheel mount 32 mounted on the lower end of a rotating shaft 31a rotatably supported by the unit housing 31 and has a lower surface on which plural grinding abrasive stones 33a are annularly disposed. The coarse grinding unit 3 further includes an electric motor 34 that is mounted on the upper end of the unit housing 31 and rotates the wheel mount 32 in a direction depicted by an arrow R3 and a moving base 35 on which the unit housing 31 is mounted. The moving base 35 is supported by the guide rails 22 disposed on the stationary support plate 21, and the coarse grinding unit 3 is moved in the upward-downward direction. The grinding apparatus 1 in the present embodiment includes a grinding feed mechanism 36 that executes grinding feeding of the moving base 35 of the coarse grinding unit 3 in the upward-downward direction. The grinding feed mechanism 36 includes a male screw rod 361 that is disposed on the stationary support plate 21 along the upward-downward direction in parallel to the guide rails 22 and is rotatably supported, a pulse motor 362 for rotationally driving the male screw rod 361, and a female screw block that is mounted on the moving base 35, screws to the male screw rod 361, and is not depicted in the diagram. The grinding feed mechanism 36 moves the coarse grinding unit 3 in the upward-downward direction by forward-rotationally and reverse-rotationally driving the male screw rod 361 by the pulse motor 362.

The finishing grinding unit 4 is also configured substantially similarly to the above-described coarse grinding unit 3 and includes a unit housing 41 and a finishing grinding wheel 43 that is mounted on a wheel mount 42 mounted on the lower end of a rotating shaft 41a rotatably supported by the unit housing 41 and has a lower surface on which plural grinding abrasive stones 43a are annularly disposed. The finishing grinding unit 4 further includes an electric motor 44 that is mounted on the upper end of the unit housing 41 and rotates the wheel mount 42 in a direction depicted by an arrow R4 and a moving base 45 on which the unit housing 41 is mounted. The moving base 45 is supported by the guide rails 23 disposed on the stationary support plate 21, and the finishing grinding unit 4 is moved in the upward-downward direction. The grinding abrasive stones 43a of the finishing grinding unit 4 are formed of finer abrasive grains than the grinding abrasive stones 33a of the coarse grinding unit 3. The grinding apparatus 1 in the present embodiment includes a grinding feed mechanism 46 that moves the moving base 45 of the finishing grinding unit 4 along the guide rails 23. The grinding feed mechanism 46 includes a male screw rod 461 that is disposed on the above-described stationary support plate 21 along the upward-downward direction in parallel to the guide rails 23 and is rotatably supported, a pulse motor 462 for rotationally driving the male screw rod 461, and a female screw block that is mounted on the moving base 45, screws to the male screw rod 461, and is not depicted in the diagram. The grinding feed mechanism 46 moves the finishing grinding unit 4 in the upward-downward direction by forward-rotationally and reverse-rotationally driving the male screw rod 461 by the pulse motor 462.

Grinding water supply means that is not depicted in the diagram is connected to rotating shaft ends 31b and 41b of the rotating shaft 31a and the rotating shaft 41a rotated by the electric motor 34 and the electric motor 44. The grinding water supply means includes a grinding water tank in which a pressure pump is incorporated. The grinding water supply means introduces grinding water L1 pumped from this grinding water tank into the rotating shaft 31a and the rotating shaft 41a and supplies the grinding water L1 via through-holes formed inside the rotating shaft 31a and the rotating shaft 41a to jet the grinding water L1 from the lower end surfaces of the coarse grinding wheel 33 and the finishing grinding wheel 43.

The grinding apparatus 1 in the present embodiment includes a turntable 5 disposed to be substantially flush with the upper surface of the apparatus housing 2 on the front side of the above-described stationary support plate 21. The turntable 5 is formed into a circular disc shape with a comparatively large diameter and is rotated as appropriate in a direction depicted by an arrow R5 by a rotational drive mechanism that is not depicted in the diagram. In the case of the present embodiment, three chuck tables 6 are disposed on the turntable 5 at even intervals. The chuck table 6 is composed of a frame body 61 with a circular disc shape and a suction adhesion chuck 62 formed with a porous ceramic material and sucks and holds a workpiece placed on the suction adhesion chuck 62 by actuating suction means that is not depicted in the diagram. The frame body 61 configures an outer rim part that supports the suction adhesion chuck 62 and surrounds the suction adhesion chuck 62. The upper surface of the suction adhesion chuck 62 and the outer rim part of the frame body 61 are configured to be flush with each other in the height. The chuck table 6 configured as above is rotated in a direction depicted by an arrow R6 by a rotational drive mechanism that is not depicted in the diagram. The three chuck tables 6 disposed on the turntable 5 are sequentially moved to a workpiece carrying-in/out area A→a coarse grinding processing area B→a finishing grinding processing area C→the workpiece carrying-in/out area A every time the turntable 5 is rotated by 120 degrees in the direction depicted by the arrow R5.

The grinding apparatus 1 includes a first cassette 7 that is disposed on one side relative to the workpiece carrying-in/out area A and in which the wafers W that are workpieces before grinding processing are stocked and a second cassette 8 that is disposed on the other side relative to the workpiece carrying-in/out area A and in which the wafers W that are workpieces after grinding processing are stocked. The grinding apparatus 1 further includes a temporary placement region 9 that is disposed between the first cassette 7 and the workpiece carrying-in/out area A and executes center alignment of a workpiece and a cleaning unit 11. Furthermore, the grinding apparatus 1 includes a first conveying mechanism 12 that carries out the wafer W that is the workpiece housed in the first cassette 7 to the temporary placement region 9 and conveys the wafer W cleaned by the cleaning unit 11 to the second cassette 8, a second conveying mechanism 13 that conveys the wafer W that is placed on the temporary placement region 9 and for which center alignment has been executed onto the chuck table 6 positioned at the workpiece carrying-in/out area A, and a third conveying mechanism 14 that conveys, to the cleaning unit 11, the wafer W after grinding processing placed on the chuck table 6 positioned at the workpiece carrying-in/out area A.

On the front side of the first conveying mechanism 12 on the apparatus housing 2, an operation panel 15 for allowing an operator to order grinding processing and specify a processing condition, a display monitor 16 that displays the situation at the time of grinding processing and has a touch panel function, and so forth are disposed. In the grinding apparatus 1 of the present embodiment, besides the above-described configuration, control means for controlling each working unit, thickness measuring instruments that are disposed adjacent to each of the coarse grinding processing area B and the finishing grinding processing area C and measure the thickness of a wafer (none is depicted in the diagram), and so forth are disposed.

Figure 6:
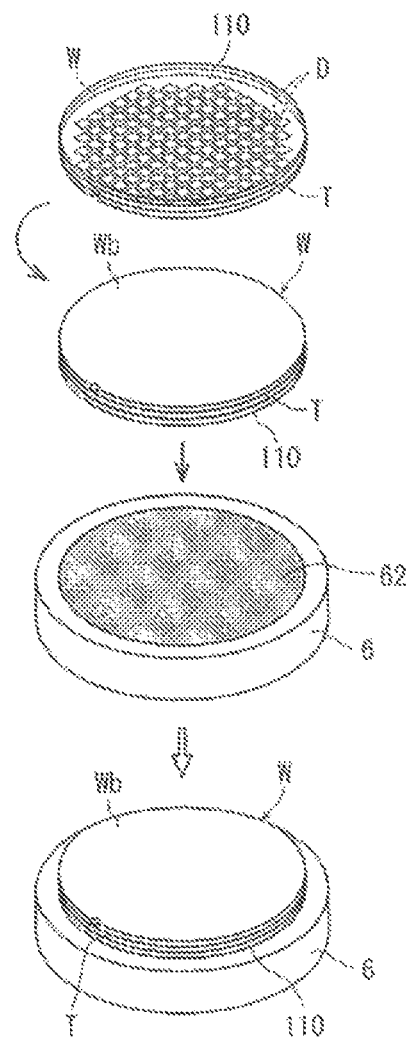
FIG. 6 is a perspective view depicting the form of holding a wafer on a chuck table of the grinding apparatus depicted in FIG. 5.
Figure 7:
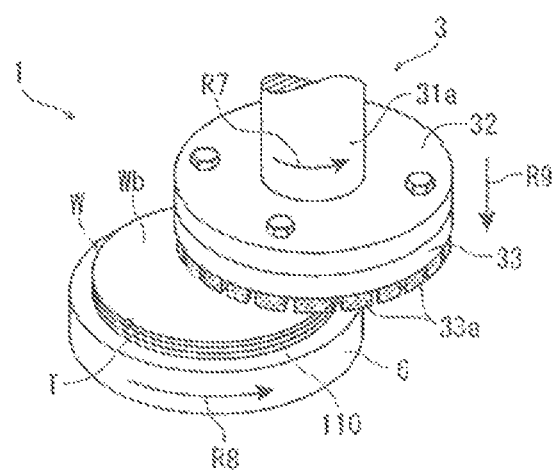
FIG. 7 is a perspective view depicting the form of executing a grinding step by the grinding apparatus depicted in FIG. 5.

The grinding apparatus 1 of the present embodiment substantially has the above-described configuration. With reference to FIG. 5 to FIG. 7, the grinding step executed by use of the grinding apparatus 1 will be described. The grinding step to be described below will be explained based on an example composed of a coarse grinding step executed by the coarse grinding unit 3 and a finishing grinding step executed by the finishing grinding unit 4. However, the present invention is not limited thereto, and the grinding step may be composed of only one grinding step.

In the execution of the grinding step, as depicted in FIG. 6, the wafer W for which the thermocompression bonding sheet 110 has been pressure-bonded onto the adhesive tape T and been integrated is inverted and placed on the suction adhesion chuck 62 of the chuck table 6 positioned at the workpiece carrying-in/out area A of the grinding apparatus 1 in such a manner that the side of the back surface Wb is oriented upward and the side of the thermocompression bonding sheet 110 is oriented downward. The suction adhesion chuck 62 of the chuck table 6 is connected to the suction means that is not depicted in the diagram, and causes a suction force to act through actuation of the suction means to suck and hold the wafer W on the chuck table 6.

After the wafer W has been sucked and held on the chuck table 6 positioned at the workpiece carrying-in/out area A, the turntable 5 of the grinding apparatus 1 is rotated by 120 degrees in the direction depicted by R5, and the chuck table 6 that sucks and holds the wafer W is positioned directly under the coarse grinding unit 3. Subsequently, as depicted in FIG. 7, while the rotating shaft 31a of the coarse grinding unit 3 is rotated in a direction depicted by an arrow R7 at 6000 rpm, for example, the chuck table 6 is rotated in a direction depicted by an arrow R8 at 300 rpm, for example. Then, the grinding abrasive stones 33a are brought into contact with the back surface Wb of the wafer W, and grinding feeding of the coarse grinding wheel 33 is executed downward, i.e. in the direction perpendicular to the chuck table 6, at a grinding feed rate of 1 μm/s, for example. At this time, the grinding water L1 is supplied from the lower surface of the coarse grinding wheel 33 to the ground surface of the wafer W, i.e. the back surface Wb, through the rotating shaft 31a. Furthermore, simultaneously with this, the grinding can be advanced while the thickness of the wafer W is measured by a contact-type measurement gauge that is not depicted in the diagram. Thus, coarse grinding of the back surface Wb of the wafer W is executed to cause the wafer W to have the desired thickness in the coarse grinding, so that the coarse grinding step is completed.

After the coarse grinding step has been completed as described above, the turntable 5 is further rotated by 120 degrees in the direction depicted by R5 in FIG. 5, and the chuck table 6 is moved to directly under the finishing grinding unit 4. After the chuck table 6 has been moved to directly under the finishing grinding unit 4, while the rotating shaft 41a of the finishing grinding unit 4 is rotated at 6000 rpm, for example, the chuck table 6 is rotated at 300 rpm, for example. Then, the grinding abrasive stones 43a are brought into contact with the back surface Wb of the wafer W, and grinding feeding of the finishing grinding wheel 43 is executed downward, i.e. in the direction perpendicular to the chuck table 6, at a grinding feed rate of 0.1 μm/s, for example. At this time, the grinding water L1 is supplied from the lower surface of the finishing grinding wheel 43 to the ground surface of the wafer W, i.e. the back surface Wb, through the rotating shaft 41a. Furthermore, simultaneously with this, the grinding can be advanced while the thickness of the wafer W is measured by a contact-type measurement gauge that is not depicted in the diagram. Thus, the back surface Wb of the wafer W is ground to cause the wafer W to have the desired thickness in the finishing grinding, so that the finishing grinding step is completed and the grinding step composed of the above-described coarse grinding step and the finishing grinding step is completed.

After the grinding step has been completed as described above, the turntable 5 is further rotated by 120 degrees in the direction depicted by R5, and the chuck table 6 is positioned at the workpiece carrying-in/out area A. The side of the back surface Wb of the wafer W positioned at the workpiece carrying-in/out area A is sucked by actuation of the third conveying mechanism 14, and the wafer W is conveyed to the cleaning unit 11. Then, a cleaning step in which the ground surface of the wafer W, i.e. the back surface Wb of the wafer W, is cleaned by the cleaning unit 11 is executed. The wafer W that has been cleaned by the cleaning step and from which water has been removed is subjected to suction adhesion by the first conveying mechanism 12 and is conveyed to a predetermined position in the second cassette 8 to be housed therein.

Separation Step

After the above-described grinding step and cleaning step have been completed, the separation step of separating the thermocompression bonding sheet 110 that has been pressure-bonded to be integrated in the above-described integration step from the side of the adhesive tape T of the wafer W housed in the second cassette 8 is executed. The separation step will be described below with reference to FIG. 8 and FIG. 9.

Figure 8:
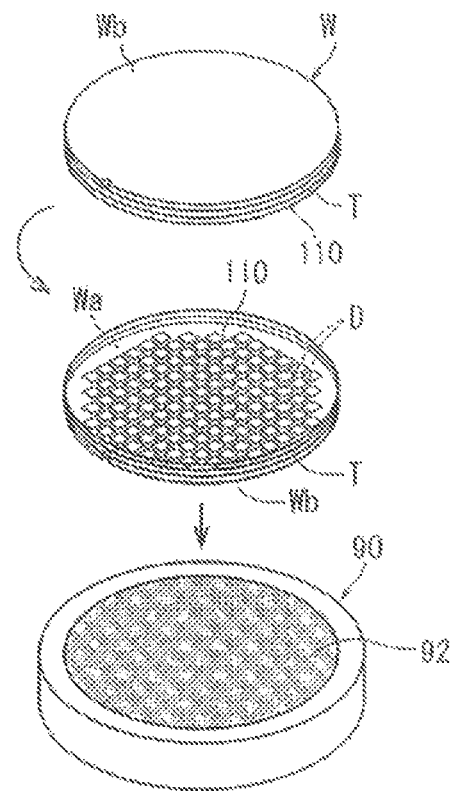
FIG. 8 is a perspective view depicting the form of placing the wafer on a chuck table for separation with which a separation step is executed.
Figure 9:
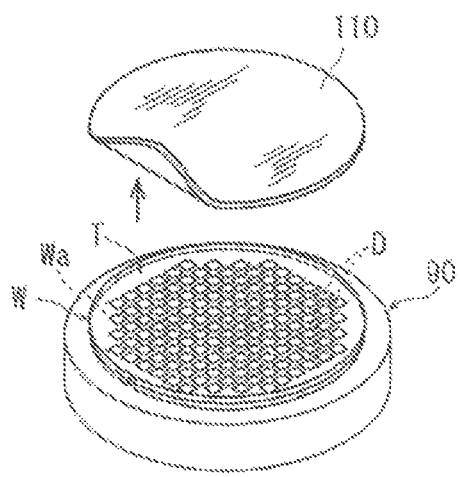
FIG. 9 is a perspective view depicting the implementation form of the separation step.

For the execution of the separation step, a chuck table 90 for separation like one depicted in FIG. 8 is prepared. The chuck table 90 for separation includes, at the center, a suction adhesion chuck 92 that is composed of porous ceramic having air permeability and has a circular disc shape. The suction adhesion chuck 92 is connected to suction means that is not depicted in the diagram. The wafer W for which grinding processing has been executed is carried out from the second cassette 8. Then, the side on which the thermocompression bonding sheet 110 is stuck is oriented upward and the side of the back surface Wb is placed on the suction adhesion chuck 92 to be sucked and held. Subsequently, cooling treatment or heating treatment is partly executed for the circumferential part of the thermocompression bonding sheet 110 of the wafer W sucked and held by the suction adhesion chuck 92 through actuation of cooling means or heating means that is not depicted in the diagram, and a temperature difference is generated between the circumferential part and the other part to make the state in which the thermocompression bonding sheet 110 is easily separated from the circumferential part. Thereafter, as depicted in FIG. 9, in the state in which the wafer W is sucked and held by the suction adhesion chuck 92, the thermocompression bonding sheet 110 is separated from the adhesive tape T by use of the circumferential part for which the above-described cooling treatment or heating treatment has been executed as the point of origin. Through the above, the separation step is completed.

According to the above-described present embodiment, the thermocompression bonding sheet 110 pressure-bonded to the adhesive tape T stuck to the front surface Wa of the wafer W is planarized. Therefore, even when the wafer W is held by the chuck table 6 of the grinding apparatus 1 and the grinding step is executed, it is hard for grinding dust to enter from a gap between the thermocompression bonding sheet 110 and the holding surface of the chuck table 6. Furthermore, even if grinding dust adheres to the thermocompression bonding sheet 110, the adhesion force of the grinding dust is weak because the thermocompression bonding sheet is planarized. Thus, the adhesion of the grinding dust to the thermocompression bonding sheet 110 is suppressed. Moreover, even if the adhesion of minute grinding dust to the thermocompression bonding sheet 110 occurs, the thermocompression bonding sheet 110 is separated from the adhesive tape T by execution of the above-described separation step before the wafer W is conveyed to the next step. Therefore, the adhesion of the grinding dust to the adhesive tape T is avoided, so that the problem that the grinding dust adhering to the thermocompression bonding sheet 110 becomes a contamination source in the next step is completely solved. Thus, the adhesive tape T can be allowed to function as a protective component as it is in the next step.

In the above-described embodiment, a polyethylene sheet is employed as the thermocompression bonding sheet 110. However, the present invention is not limited thereto, and the thermocompression bonding sheet 110 can be selected as appropriate from polyolefin-based sheets or polyester-based sheets.

When being selected from the polyolefin-based sheets, the thermocompression bonding sheet 110 can be selected from either a polypropylene sheet or a polystyrene sheet besides the polyethylene sheet. When the polypropylene sheet is selected as the thermocompression bonding sheet 110, it is preferable to set the temperature in the heating in the integration step to 160° C. to 180° C. Furthermore, when the polystyrene sheet is selected as the thermocompression bonding sheet 110, it is preferable to set the temperature in the heating in the integration step to 220° C. to 240° C.

Moreover, when being selected from the polyester-based sheets, the thermocompression bonding sheet 110 can be selected from a polyethylene terephthalate sheet or a polyethylene naphthalate sheet. When the polyethylene terephthalate sheet is selected as the thermocompression bonding sheet 110, it is preferable to set the temperature in the heating in the integration step to 250° C. to 270° C. Furthermore, when the polyethylene naphthalate sheet is selected as the thermocompression bonding sheet 110, it is preferable to set the temperature in the heating in the integration step to 160° C. to 180° C.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing method of a wafer for grinding a back surface of the wafer on which a plurality of devices are formed on a front surface in such a manner as to be marked out by a plurality of planned dividing lines that intersect, the processing method comprising:
   an adhesive tape sticking step of sticking an adhesive tape to the front surface of the wafer;
   a thermocompression bonding sheet disposing step of disposing a thermocompression bonding sheet on the adhesive tape stuck to the front surface of the wafer;
   an integration step of heating the thermocompression bonding sheet and pressing the thermocompression bonding sheet by a flat member to execute pressure bonding of the thermocompression bonding sheet to the adhesive tape and integrate the thermocompression bonding sheet with the wafer;
   a grinding step of holding a side of the thermocompression bonding sheet on a chuck table of a grinding apparatus and grinding the wafer into a desired thickness while supplying grinding water to the back surface of the wafer, after the integration step is executed; and
   a separation step of carrying out the wafer integrated with the thermocompression bonding sheet from the chuck table and separating the thermocompression bonding sheet from the adhesive tape, wherein
   the thermocompression bonding sheet is partly heated or cooled, and a temperature difference is generated to separate the thermocompression bonding sheet from the adhesive tape in the separation step.

2. A processing method of a wafer for grinding a back surface of the wafer on which a plurality of devices are formed on a front surface in such a manner as to be marked out by a plurality of planned dividing lines that intersect, the processing method comprising:
   an adhesive tape sticking step of sticking an adhesive tape to the front surface of the wafer;
   a thermocompression bonding sheet disposing step of disposing a thermocompression bonding sheet on the adhesive tape stuck to the front surface of the wafer;
   an integration step of heating the thermocompression bonding sheet and pressing the thermocompression bonding sheet by a flat member to execute pressure bonding of the thermocompression bonding sheet to the adhesive tape and integrate the thermocompression bonding sheet with the wafer;
   a grinding step of holding a side of the thermocompression bonding sheet on a chuck table of a grinding apparatus and grinding the wafer into a desired thickness while supplying grinding water to the back surface of the wafer, after the integration step is executed; and
   a separation step of carrying out the wafer integrated with the thermocompression bonding sheet from the chuck table and separating the thermocompression bonding sheet from the adhesive tape, wherein the thermocompression bonding sheet is a polyolefin-based sheet selected from a group consisting of a polyethylene sheet, a polypropylene sheet and a polystyrene sheet wherein a temperature when the thermocompression bonding sheet is heated in the integration step is 120° C. to 140°° C. when the thermocompression bonding sheet is the polyethylene sheet, the temperature is 160° C. to 180° C. when the thermocompression bonding sheet is the polypropylene sheet, and the temperature is 220° C. to 240° C. when the thermocompression bonding sheet is the polystyrene sheet.

3. A processing method of a wafer for grinding a back surface of the wafer on which a plurality of devices are formed on a front surface in such a manner as to be marked out by a plurality of planned dividing lines that intersect, the processing method comprising:

an adhesive tape sticking step of sticking an adhesive tape to the front surface of the wafer;

a thermocompression bonding sheet disposing step of disposing a thermocompression bonding sheet on the adhesive tape stuck to the front surface of the wafer;

an integration step of heating the thermocompression bonding sheet and pressing the thermocompression bonding sheet by a flat member to execute pressure bonding of the thermocompression bonding sheet to the adhesive tape and integrate the thermocompression bonding sheet with the wafer;

a grinding step of holding a side of the thermocompression bonding sheet on a chuck table of a grinding apparatus and grinding the wafer into a desired thickness while supplying grinding water to the back surface of the wafer, after the integration step is executed; and a separation step of carrying out the wafer integrated with the thermocompression bonding sheet from the chuck table and separating the thermocompression bonding sheet from the adhesive tape, wherein the thermocompression bonding sheet is a polyester-based sheet selected from either a polyethylene terephthalate sheet or a polyethylene naphthalate sheet, wherein a temperature when the thermocompression bonding sheet is heated in the integration step is 250° C. to 270° C. when the thermocompression bonding sheet is the polyethylene terephthalate sheet, and the temperature is 160° C. to 180° C. when the thermocompression bonding sheet is the polyethylene naphthalate sheet.

\* \* \* \* \*

UNITED STATES PATENT AND TRADEMARK OFFICE
CERTIFICATE OF CORRECTION

| | | |
|---|---|---|
| PATENT NO. | : 12,255,086 B2 | Page 1 of 1 |
| APPLICATION NO. | : 16/997332 | |
| DATED | : March 18, 2025 | |
| INVENTOR(S) | : Kohei Tsujimoto | |

It is certified that error appears in the above-identified patent and that said Letters Patent is hereby corrected as shown below:

In the Claims

Claim 2, Column 13, Line 5:
Add a "," after "polypropylene sheet"

Claim 2, Column 13, Line 6:
Add a "," after "sheet"

Claim 2, Column 13, Line 9:
Delete extra "°" from "140°°C"

Signed and Sealed this
Ninth Day of December, 2025

John A. Squires
*Director of the United States Patent and Trademark Office*